United States Patent
Yamashita et al.

(10) Patent No.: US 7,564,101 B2
(45) Date of Patent: Jul. 21, 2009

(54) SEMICONDUCTOR DEVICE FOR PROTECTING A CIRCUIT FORMED ON A SEMICONDUCTOR CHIP FROM DESTRUCTION CAUSED BY AN ELECTROSTATIC DISCHARGE

(75) Inventors: Yasuhiro Yamashita, Nukata-gun (JP); Tadashi Kunou, Nishio (JP)

(73) Assignee: DENSO CORPORATION, Kariya (JP)

( * ) Notice: Subject to any disclaimer, the term of this patent is extended or adjusted under 35 U.S.C. 154(b) by 39 days.

(21) Appl. No.: 11/208,633

(22) Filed: Aug. 23, 2005

(65) Prior Publication Data

US 2006/0054999 A1 Mar. 16, 2006

(30) Foreign Application Priority Data

Sep. 14, 2004 (JP) ............................. 2004-267207

(51) Int. Cl.
*H01L 23/62* (2006.01)
(52) U.S. Cl. ................ 257/355; 257/358; 257/E21.356
(58) Field of Classification Search ................ 257/603, 257/358, 363, 379, E29.218, E21.351, 173, 257/355, E21.355, E21.356; 438/171, 190, 438/210, 238, 330, 382, 983; 361/56, 91.5, 361/111, 207
See application file for complete search history.

(56) References Cited

U.S. PATENT DOCUMENTS

| | | | | |
|---|---|---|---|---|
| 5,402,020 A | * | 3/1995 | Yamakawa | ................. 327/312 |
| 5,483,093 A | | 1/1996 | Murakami | |
| 5,668,384 A | | 9/1997 | Murakami | |
| 5,838,526 A | * | 11/1998 | Ishikawa et al. | ............ 361/118 |
| 5,946,393 A | * | 8/1999 | Holcombe | ............. 379/399.01 |
| 6,501,632 B1 | * | 12/2002 | Avery et al. | .................. 361/111 |
| 6,671,147 B2 | * | 12/2003 | Ker et al. | ....................... 361/56 |
| 2005/0057866 A1 | * | 3/2005 | Mergens et al. | ................ 361/56 |

FOREIGN PATENT DOCUMENTS

| | | |
|---|---|---|
| JP | A-9-214313 | 8/1997 |
| JP | A-7-147727 | 10/2003 |

OTHER PUBLICATIONS

Notice of Preliminary Rejection from Korean Patent Office issued on Sep. 26, 2006 for the corresponding Korean patent application No. 10-2005-0085434(English translation thereof).
Notice of Final Rejection from Korean Patent Office issued on Dec. 29, 2006 for the corresponding Korean patent application No. 10-2005-0085434 (English translation thereof).
First Office Action issued on Aug. 10, 2007 in corresponding Chinese patent application No. 2005 1009 9207.X (and English translation).

* cited by examiner

*Primary Examiner*—Khiem D Nguyen
(74) *Attorney, Agent, or Firm*—Posz Law Group, PLC

(57) ABSTRACT

A semiconductor device includes a Zener diode connected between an outside terminal and ground, and a resistor connected to the Zener diode in series. The Zener diode and the resistor divide a noise voltage, so that the semiconductor device can have the high noise tolerance even if it uses the small Zener diode.

6 Claims, 4 Drawing Sheets

FIG. 1A
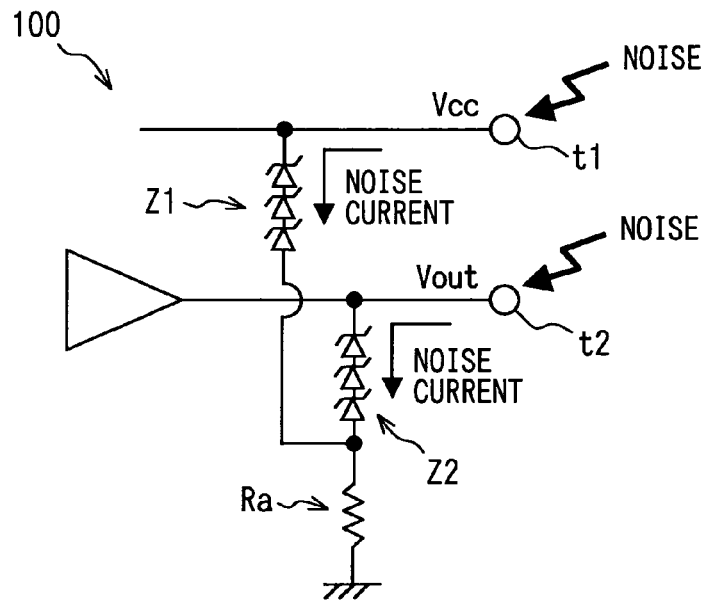
FIG. 1B
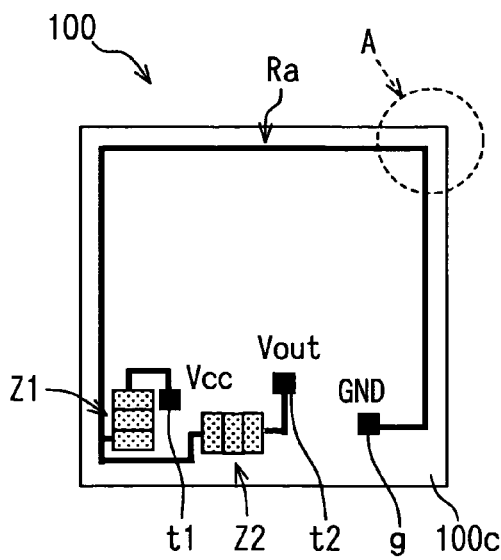
FIG. 1C
FIG. 1D
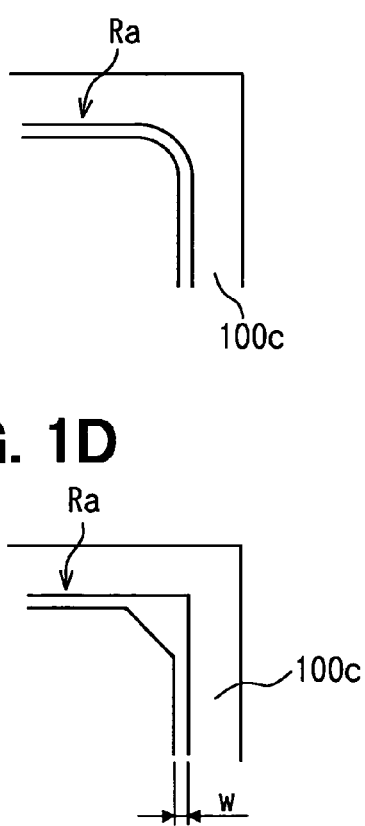

SEMICONDUCTOR DEVICE FOR PROTECTING A CIRCUIT FORMED ON A SEMICONDUCTOR CHIP FROM DESTRUCTION CAUSED BY AN ELECTROSTATIC DISCHARGE

CROSS REFERENCE TO RELATED APPLICATION

This application is based on Japanese Patent Application No. 2004-267207 filed on Sep. 14, 2004, the disclosure of which is incorporated herein by reference.

FIELD OF THE INVENTION

The present invention relates to a semiconductor device in which a Zener diode is arranged between an outside terminal and ground (GND).

BACKGROUND OF THE INVENTION

A semiconductor device in which a Zener diode is arranged between an outside terminal and GND is disclosed in, for example, JP 7-147727 A. The Zener diode is used to protect a circuit from destruction caused by electro static discharge (ESD) and noise such as surge.

FIGS. 5A and 5B are schematic views showing the semiconductor in which the Zener diode is arranged between the outside terminal and GND. FIG. 5A is a schematic view showing an equivalent circuit around the outside terminals t1 and t2 in the semiconductor device 90, and FIG. 5B is schematic top view showing arrangement of circuit elements in a semiconductor chip 90c.

In FIG. 5A, the outside terminals t1 and t2 are respectively a power terminal and an output terminal. The semiconductor device 90 includes Zener diodes Z1 and Z2, each of which includes three diodes connected in series, connected between the outside terminals t1 and t2 and GND to bypass a noise current such as ESD and surge.

As shown in FIG. 5B, the semiconductor device connects the Zener diodes Z1 and Z2 near the outside terminals t1 and t2 and a GND terminal g by a short wire to bypass the noise current to GND as soon as possible.

Recently, Zener diodes Z1 and Z2 having high noise tolerance are desirable. However, if the size of the Zener diodes Z1 and Z2 becomes larger in order to have the high noise tolerance, the semiconductor itself also becomes larger, and production costs rise.

SUMMARY OF THE INVENTION

In view of the above problem, it is an object to provide a low cost semiconductor device having high noise tolerance.

Accordingly, a semiconductor device is composed of a Zener diode arranged between an outside terminal and ground, and a resistor connected to the Zener diode in series.

A noise voltage is divided by the Zener diode and the resistor, so that the semiconductor device can have high noise tolerance even if it uses a small Zener diode. Therefore, a low cost semiconductor device having high noise tolerance may be achieved.

BRIEF DESCRIPTION OF THE DRAWINGS

The above and other objects, features and advantages of the present invention will become more apparent from the following detailed description made with reference to the accompanying drawings. In the drawings:

FIG. 1A is a schematic view showing an equivalent circuit around an outside terminal in the semiconductor;

FIG. 1B is a top view showing arrangement of a circuit element shown in FIG. 1A;

FIGS. 1C and 1D are magnified views showing a portion "A" enclosed in dashed line shown in FIG. 1B;

DETAILED DESCRIPTION OF THE PREFERRED EMBODIMENTS

In FIG. 1A, a power terminal and an output terminal are shown as outside terminals. The Zener diodes Z1 and Z2, each of which includes three diodes connected in series, are connected between the outside terminals t1 and t2 and ground. The Zener diodes Z1 and Z2 are connected to a resistor Ra in series, and are connected between the outside terminals t1 and t2 and ground through the resistor Ra. Therefore, a noise voltage such as ESD and a surge, which is applied to the outer terminals t1 and t2, is divided by the Zener diodes Z1 and Z2 and the resistor Ra, so that the semiconductor device 100 can have the high noise tolerance even if it uses small Zener diodes Z1 and Z2.

The resistor Ra is formed by an aluminum wire, as shown in FIG. 1B. The resistor Ra may be formed by a thin layer of chrome-silicon (Cr—Si) or impurity diffused layer of silicon.

The resistor Ra is formed in an aluminum wiring process, in which circuit elements are conventionally connected to each other, so that another process such as forming of thin layer resistor of Cr—Si is not needed. Therefore, the semiconductor can be produced at low cost.

Width of the wiring of the resistor Ra is more than 40 micrometer, so that a permitted current density of the resistor Ra can be increased. Therefore, destruction of the resistor Ra by large noise such as ESD and surge can be prevented.

A wiring pattern of the resistor Ra is arranged at a periphery of a semiconductor chip 100c. Though the long wiring pattern is needed because aluminum is low resistivity and width of the wiring is wide, another wiring pattern is not needed to be modified because the aluminum wiring is arranged at the periphery. Further, redundancy of a space arisen by formation of the resistor Ra can be eliminated.

As shown in FIG. 1C, a corner of the wire pattern of the resistor Ra may be preferably rounded. As shown in FIG. 1D, the corner may be formed more widely than the wire width w. The large noise such as ESD and surge is reduced by the corner, so that destruction of the resistor Ra at the corner can be prevented.

Figure 2:
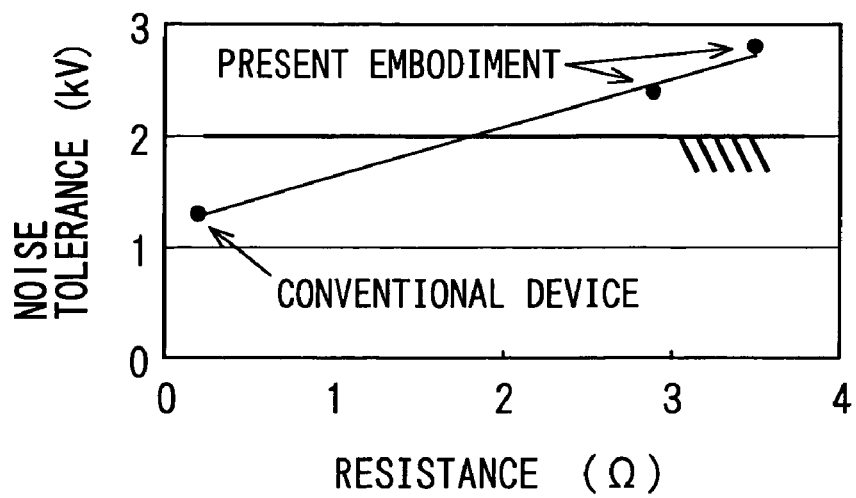
FIG. 2 is a graph showing an evaluation result of noise tolerance for a noise injecting test.

In a related semiconductor, two Zener diodes, each of which includes three diodes connected in series, are arranged near the outside terminal and ground terminal. The diodes are connected to the terminals by the short aluminum wire. The resistor of the aluminum wire is about 0.2 ohm ($\Omega$). As shown in FIG. 2, noise tolerance for noise injecting test of the related semiconductor is about 1.3 kV. In the present invention, as shown in FIG. 2, when the resistance of the aluminum wire is 2.9 Ω or 3.5 Ω, noise tolerance respectively becomes about 2.4 kV or 2.8 kV.

The resistor Ra may be preferably more than 2 Ω, so that tolerated dose for noise injection can become more than 2 kV.

Figure 3:
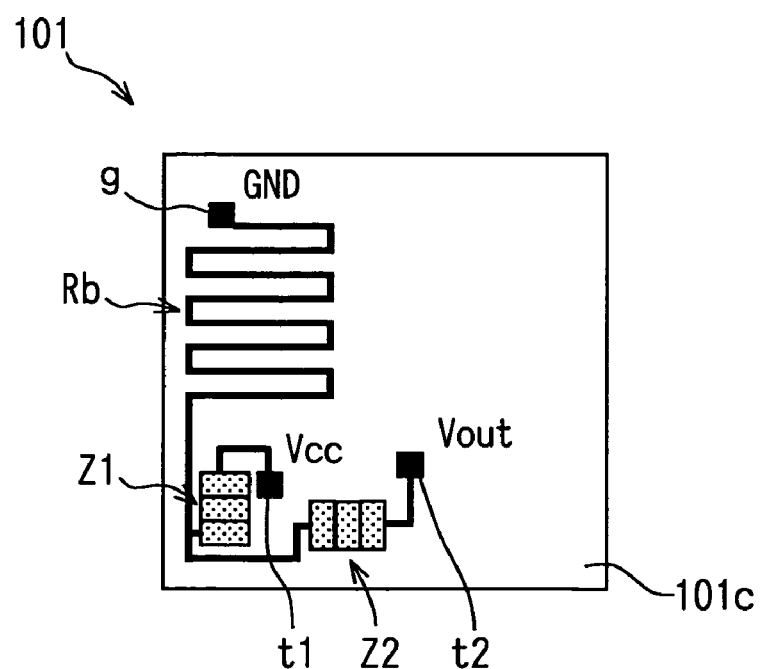
FIG. 3 is a top view showing arrangement of a circuit element.

The wire pattern of the resistor Ra may be multiple folded shapes, as shown in FIG. 3, so that the resistor Ra can save a space on the semiconductor chip 100c. The wire pattern may be one folded shape.

Figure 4A:
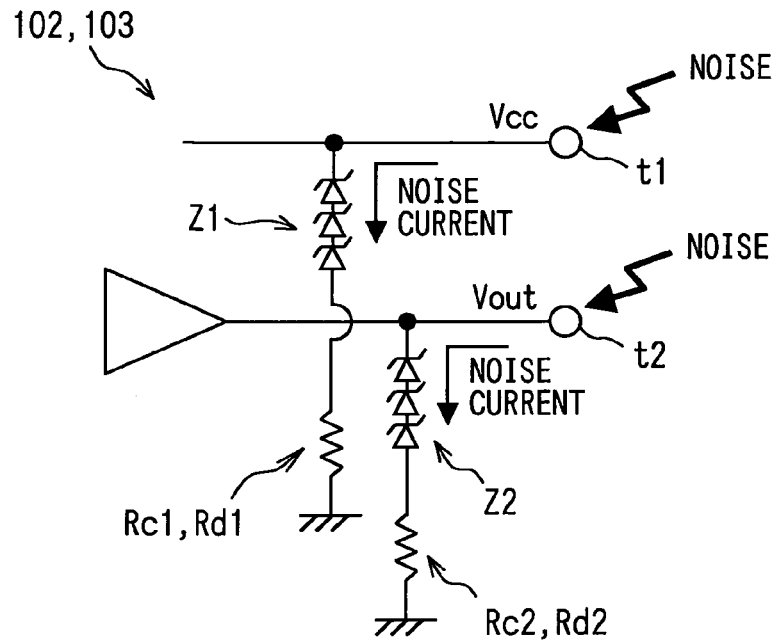
FIG. 4A is a schematic view showing an equivalent circuit around an outside terminal in the semiconductor.
Figure 4B:
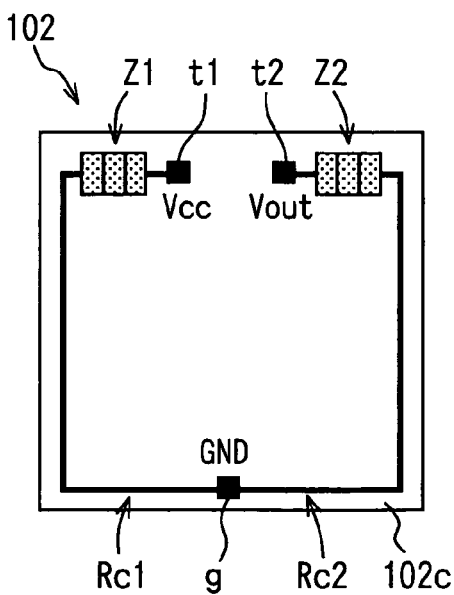
FIGS. 4B and 4C are top views showing arrangement of a circuit element shown in FIG. 4A.
Figure 4C:
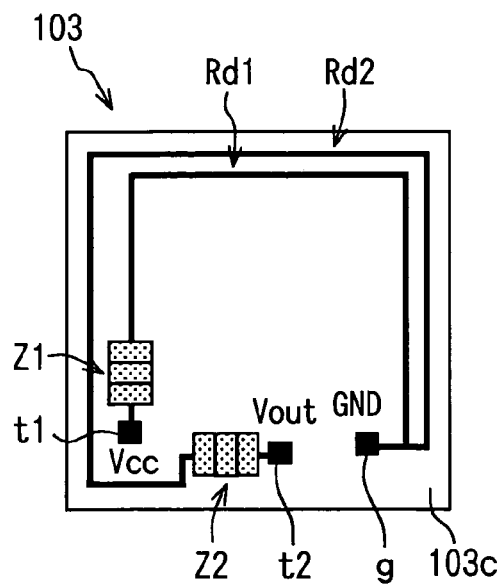
Figure 5A:
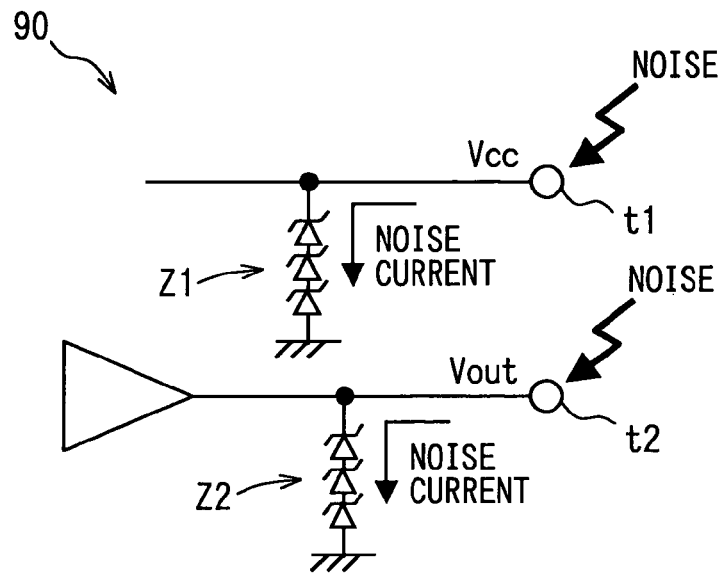
FIG. 5A is a schematic view showing an equivalent circuit around an outside terminal in the semiconductor.
Figure 5B:
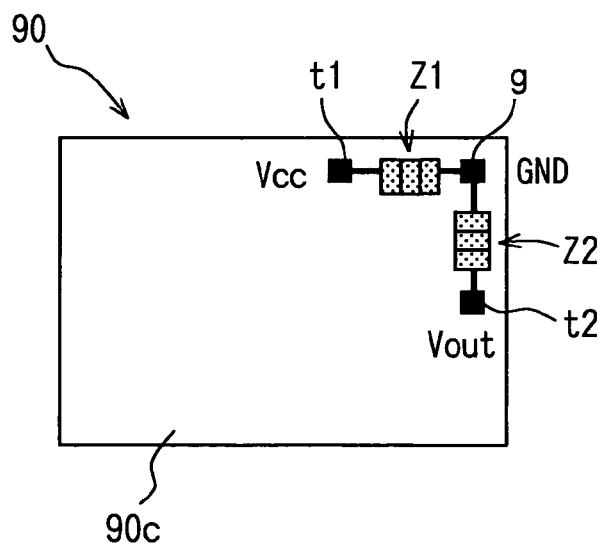
FIG. 5B is a top view showing arrangement of a circuit element shown in FIG. 5A.

As shown in FIGS. 4A-4C, the outer terminal t1 and Zener diode Z1 may be connected to a resistor Rc1 or Rd1 in series, and the outer terminal t2 and the Zener diode Z2 may be connected to a resistor Rc2 or Rd2 in series. That is, each resistor is independently connected to each of the Zener diodes Z1 and Z2.

As shown in FIGS. 1A and 1B, and in FIG. 3, one resistor is commonly arranged at both Zener diodes Z1 and Z2, so that the space for the resistor can be saved. Therefore, the semiconductor device can be small and have the high noise tolerance. Further, the resistor may be arranged at not downside (GND terminal side), as shown in FIGS. 4A-4C, but upside (outside terminal side) of the Zener diodes Z1 and Z2. Moreover, the resistor may be arranged at both sides of the Zener diodes Z1 and Z2.

As described above, the semiconductors 100-103, which include Zener diodes Z1 and Z2 arranged between outside terminals t1 and t2 and GND on a semiconductor chip 100c, comprise the resistor connected to the Zener diodes Z1 and Z2 in series, so that the semiconductor of the present embodiment can provide the low cost semiconductor device having high noise tolerance.

What is claimed is:

1. A semiconductor device for protecting a circuit, formed on a semiconductor chip and having an outside terminal and a ground terminal, from destruction caused by an electrostatic discharge, comprising:
   a Zener diode circuit formed on the semiconductor chip to be disposed between the outside terminal and the ground terminal, the Zener diode circuit including a plurality of Zener diodes; and
   a resistor formed on the semiconductor chip to be connected to the Zener diode circuit in series to increase noise tolerance of the Zener diode circuit, the resistor being formed by a wire pattern of an aluminum wire to extend along a periphery of the semiconductor chip so as to provide a resistance of approximately 2 ohms or greater.

2. A semiconductor device according to claim 1, wherein width of the wiring pattern is more than 40 micrometer.

3. A semiconductor device according to claim 1, wherein the semiconductor chip has a rectangular surface on. which the wire pattern is arranged at the periphery thereof to have a corner, and the corner of the wiring pattern is rounded.

4. A semiconductor device according to claim 3, wherein the corner of the wiring pattern is formed more widely than width of the wire.

5. A semiconductor device according to claim 1, wherein the wiring pattern is formed in a folded shape.

6. A semiconductor device according to claim 5, wherein the wiring pattern is formed in the multiple folded shapes.

* * * * *